United States Patent [19]

Yamada et al.

[11] Patent Number: 4,603,348
[45] Date of Patent: Jul. 29, 1986

[54] METHOD FOR COMPOSING ADDRESSES OF A MEMORY

[75] Inventors: Mitsuhiko Yamada, Kyoto; Tsukasa Nishida, Osaka; Toshifumi Inoue, Kyoto, all of Japan

[73] Assignee: Dainippon Screen Seizo Kabushiki Kaisha, Japan

[21] Appl. No.: 460,286

[22] Filed: Jan. 24, 1983

[30] Foreign Application Priority Data

Jan. 27, 1982 [JP] Japan ................... 57-11180

[51] Int. Cl.$^4$ ............. H04N 1/46; G11C 7/00
[52] U.S. Cl. ................... 358/75; 365/189; 382/56; 382/44
[58] Field of Search ........... 358/75; 382/56, 44; 365/189

[56] References Cited

U.S. PATENT DOCUMENTS 4,346,401  8/1982  Ohara .................... 358/75
4,509,194  4/1985  Harrington ............... 382/56

Primary Examiner—James J. Groody
Attorney, Agent, or Firm—Ostrolenk, Faber, Gerb & Soffen

[57] ABSTRACT

A method for subdividing the addresses of a multi-dimensional memory, having n-dimensional addresses defined over a logical address space which is divided into a plurality of unit divisions. Each unit division has several vertices each of which is addressable by one of the n-dimensional addresses. Each one of the addresses associated with a given unit division is divided and allocated to a distinct memory bank so that no two addresses of the same unit division are in the same memory bank. There are a total of $2^n$ memory banks, each having independent data lines and address lines. The original n-dimensional address of the vertices determines to which memory bank the vertex address will be allocated. Moreover, the n-dimensional address also determines the address of the given vertex within the memory bank to which it has been allocated. Thus, the data corresponding to all the vertices of a given unit division can be accessed simultaneously to thereby significantly reduce data retrieval times in many applications.

15 Claims, 7 Drawing Figures

| (0) | (32767) |
| (1) | (32768) |
| (2) | (32769) |
| ⋮ | ⋮ |
| (32766) | (65535) |

(b)

| (0) | (1) |
| (2) | (3) |
| (4) | (5) |
| ⋮ | ⋮ |
| (65534) | (65535) |

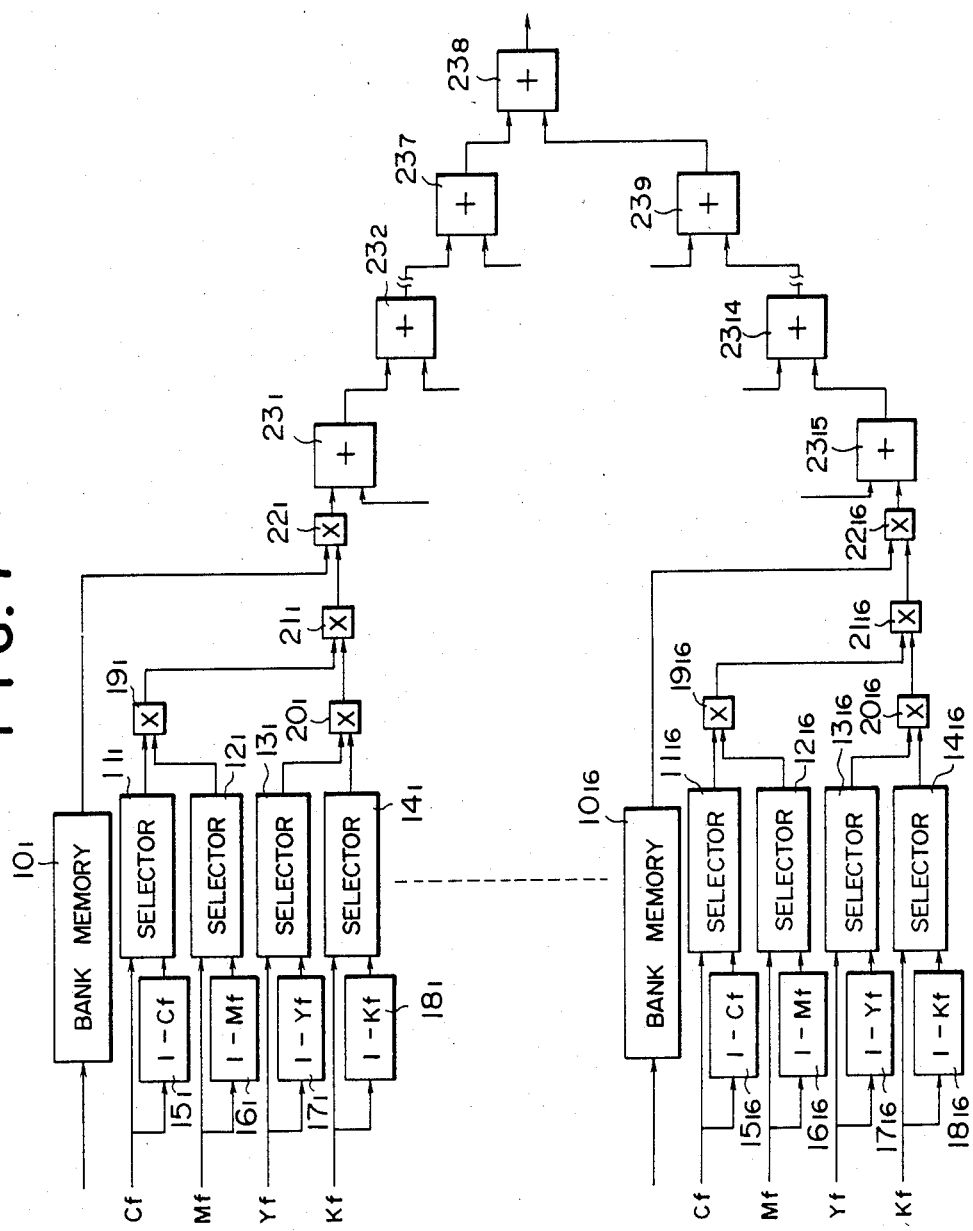

METHOD FOR COMPOSING ADDRESSES OF A MEMORY

BACKGROUND OF THE INVENTION

The present invention relates to a method for generating addresses of a memory in which a plurality of data corresponding to a plurality of addresses can be assessed simultaneously.

Ordinarily, while a data is written in or read out of one address of a memory, the other memory addresses or locations cannot be accessed. If a plurality of addresses were accessible simultaneously, many advantages are realized, including an increase in processing speed due to the reduction of the access time, and so forth.

A method wherein a plurality of memory locations are accessed at the same time, has been proposed by the prior art. The ability to access, simultaneously, several memory locations is very important particularly when interpolation calculations are to be carried out. Under such circumstances, it is very useful to retrieve data located in adjacent memory locations simultaneously, because the value of an unknown parameter is calculated by interpolating between the adjacent values which are retrieved from the memory. Although the prior art teaches a method for simultaneous retrieval of adjacent data, that method is applicable to one dimensional data space only. For example, when addresses (x) which correspond to the numbers 0, 1, 2, 3, ..., increase solely along one-dimention, a memory 1 having addresses continuously composed, as shown in FIG. 1, is separated into a plurality of distinct memory banks, and the addresses are not stored continuously into the plurality (two in this embodiment) of memory banks 2 and 3, as shown in FIG. 2a, but instead are stored in an interlace fashion into bank memories 4 and 5 by a so-called memory interlacing method, as shown in FIG. 2b. According to the memory interlacing method, the adjacent addresses such as (2) and (3), or (15) and (16) can be accessed at the same time.

However, in a conventional memory such as a table memory having 2-dimensional addresses (x,y), wherein x is a progression of 0, 1, 2, 3, ... and y is a progression of 0, 1, 2, 3, ..., a plurality of addresses i.e. memory locations cannot be accessed at the same time. The prior art interlacing method which is applicable to one-dimensional addresses cannot be used with 2-dimensional memories. Accordingly, there exists no effective way for dividing a multi-dimensionally organized memory into distinct memory banks to enable simultaneous accessing of data according to known art.

SUMMARY OF THE INVENTION

It is an object of the present invention to provide a method for deriving addresses in connection with a memory having n-dimensional addresses defined over a logical address space consisting of a plurality of unit divisions, each unit division having vertices defined by the n-dimensional address. The generated addresses are so arranged and selected as to enable the simultaneous accessing of a plurality of data elements located at respective n-dimensional addresses.

According to the present invention there is provided a method for deriving addresses of a memory, which comprises dividing the n-dimensional addresses of a memory space organized in a logical address space consisting of a plurality of unit divisions, each having vertices with the n-dimensional addresses, into $2^n$ memory banks, each having independent data lines and address lines. The addresses are so divided that each of the addresses which correspond to a single unit division and which define the vertices of that unit are located in different memory banks. With this arrangement, all the addresses of the vertices of the unit division can be accessed at the same time. Moreover, the invention specifies the relationship between a given n-dimensional address and the memory bank to which it is allocated as well as the location of that address within its respective memory bank.

BRIEF DESCRIPTION OF THE DRAWINGS

In order that the present invention may be better understood, preferred embodiments thereof will be described with reference to the accompanying drawings, in which:

FIG. 1 shows addresses of a memory, which are organized in a conventional manner;

FIG. 2(a) shows addresses stored in two conventional memory banks and FIG. 2(b) shows addresses stored according to a conventional memory interlacing method;

FIG. 7 is a block diagram of arithmetic circuits for performing the interpolation according to the present invention.

DESCRIPTION OF THE PREFERRED EMBODIMENTS

The present invention will now be described in connection with FIGS. 3-7. A logical address space of a memory having n-dimensional addresses is composed of a plurality of unit divisions, each having vertices with the n-dimensional addresses. In a two-dimensional system, the addresses of the vertices of one unit division having a square form are expressed as a set of addresses such as for example addresses (1,1), (2,1), (1,2) and (2,2), and so forth, and in a three-dimensional system, the addresses of the vertices of one unit division having a cubic form are expressed as a set of (1,1,1), (2,1,1), (1,2,1), (1,1,2), (2,2,1), (2,1,2), (1,2,2) and (2,2,2), and so forth.

First, in order that the present invention may be better understood, it will be explained in terms of two-dimensional addresses (x,y), wherein x means 0, 1, 2, 3, ..., and y means 0, 1, 2, 3, ....

Figure 3:
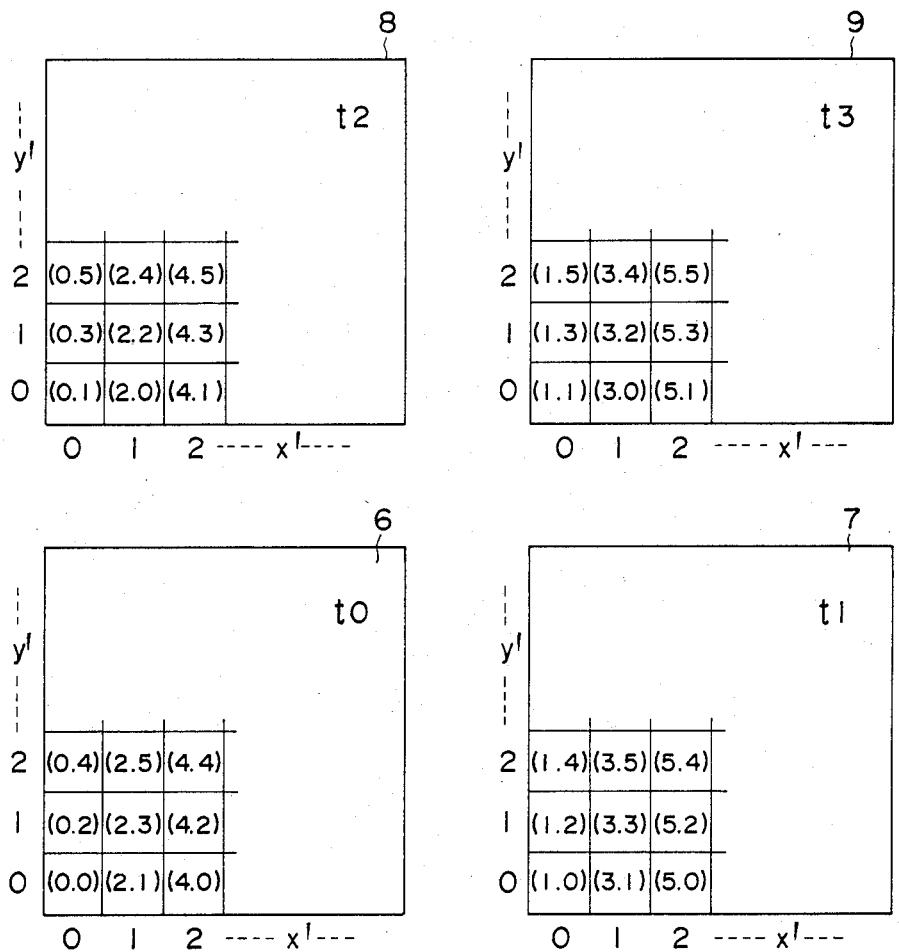
FIG. 3 shows four memory banks in which two-dimensional addresses are arranged according to the present invention.

In this embodiment, as shown in FIG. 3, the memory is divided into $2^2=4$ memory banks 6, 7, 8 and 9, hereinafter referred to as t0, t1, t2 and t3, respectively, each having independent address lines and data lnes, and each address data of the four vertices of the unit division is stored into each memory bank t0, t1, t2 or t3.

That is, when y equals zero, the address data (x,y) are stored in the memory banks: such as (0,0) into the memory bank t0, (1,0) into the memory bank t1, (2,0) into the memory bank t2, (3,0) into the memory bank t3, (4,0) into the memory bank t0, (5,0) into the memory bank t1, and the like. In general, the address data (x,y) is stored into a memory bank $tp_2$, wherein $p_2$ means a residue which is obtained by a division $(x+2y)/2^2$.

Figure 4:
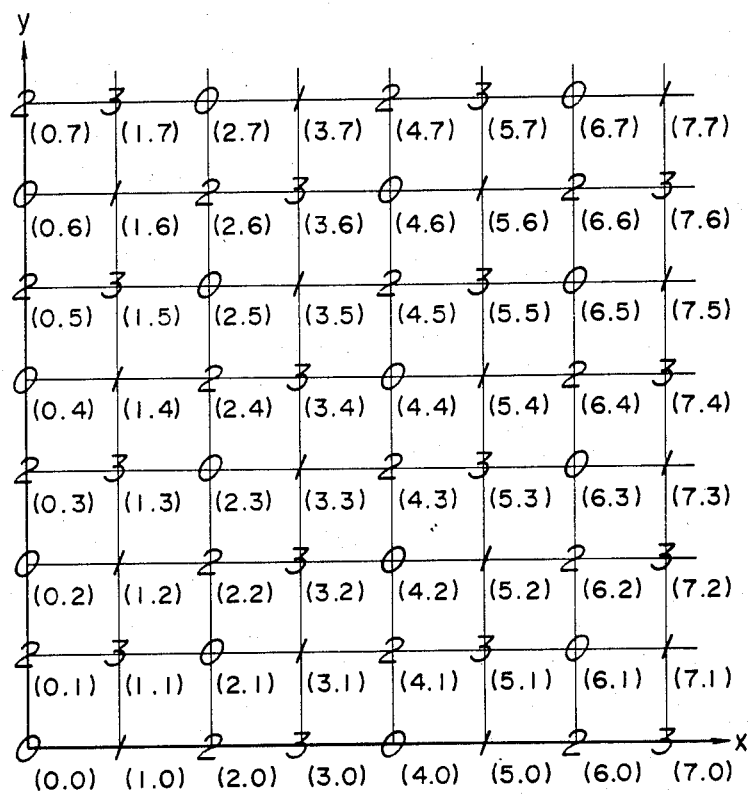
FIG. 4 shows a look-up table memory which expresses bank memory numbers and two-dimensional addresses composed according to the present invention.

This relation is shown visually in FIG. 4 showing the memory bank numbers and the two-dimensional addresses. That is, the intersections of the two lines extending in the x and y directions mean the two-dimensional addresses (0,0), (0,1), ..., and the numbers "0", "1", "2" and "3" appearing on the intersections indicate the serial numbers attached to the memory banks, i.e. "0", "1", "2" and "3" mean the memory banks t0, t1, t2 and t3, respectively.

Hence, the serial number $p_2$ of the memory bank $tp_2$ in which an address (x,y) is to be stored, is obtained by the following formula (I), shown below, wherein $MODE_2(\ )$ means a residue obtained by dividing a number in the parenthesis by $2^2$.

$$p_2 MODE_2(x+2y) \quad (I)$$

Further, as described above, the addresses of the vertices of the unit division are separately stored in the different memory banks, and accordingly the addresses stored in each memory bank are non-sequential. However, in order to distribute effectively the addresses into the different memory banks, the relation between the address (x,y) of the memory and the address (x',y') of the memory bank is determined by the following formulae (II), wherein numbers x/2 and y/2 in the parenthesis are integral numbers, ignoring the fraction that is generated by the arithmetic operation.

$$\left. \begin{array}{l} x' = \left(\frac{x}{2}\right) \\ y' = \left(\frac{y}{2}\right) \end{array} \right\} \quad (II)$$

In other words, the addresses of the vertices of each unit division are distributed into different memory banks having independent address lines and data lines.

Next, the present invention will be described with reference to a three-dimensional system, wherein each unit division has a cubic form and eight vertices. Each vertex has a three-dimensional address (x,y,z) wherein x means 0, 1, 2, 3, ..., y means 0, 1, 2, 3, ..., and z means 0, 1, 2, 3, ....

In this embodiment, the memory is divided into $2^3=8$ memory banks t0, t1, t2, t3, t4, t5, t6 and t7, each having independent address lines and data lines, and the addresses of the vertices of each unit division are so generated to permit them to be stored into the different memory banks.

Figure 5:
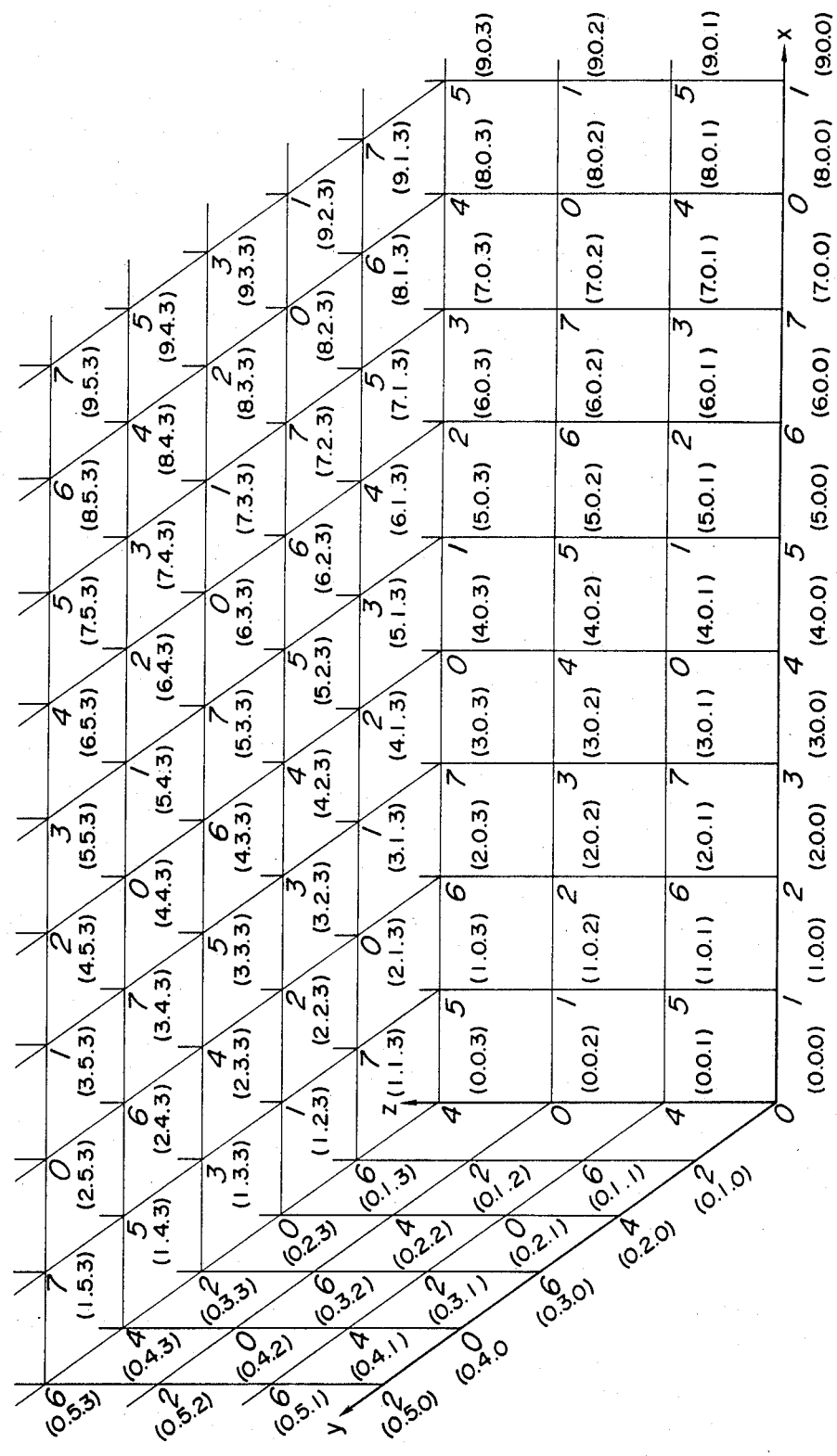
FIG. 5 shows a look-up table memory which expresses bank memory numbers and three-dimensional addresses composed according to the present invention.

For instance, when y equals zero and z equals zero, the address data (x,y,z) are stored in the memory banks as follows: (0,0,0) into the memory bank t0, (1,0,0) into the memory bank t1, (2,0,0) into the memory bank t2, (3,0,0) into the memory bank t3, (4,0,0) into the memory bank t4, (5,0,0) into the memory bank t5, (6,0,0) into the memory bank t6, (7,0,0) into the memory bank t7, (8,0,0) into the memory bank t0, and the like. Generally, an address data (x,y,z) is stored into a memory bank $tp_3$, wherein a serial number $p_3$ means a residue which is obtained by a division $(x+2y+4z)/2^3$. This relation is shown in FIG. 5 showing the memory bank numbers and the three-dimensional addresses.

The serial number $p_3$ of the memory bank $tp_3$ in which the address (x,y,z) is to be stored, is obtained in the following formula (III), wherein $MODE_3(\ )$ means a residue obtained by dividing a number in parenthesis by $2^3$.

$$p_3 = MODE_3(x+2y+4z) \quad (III)$$

In addition, the relation between the address (x,y,z) of the memory and the address (x',y',z') of each memory bank is determined in the following formulae (IV), wherein numbers x/2, y/2 and z/2 in the parenthesis are integral numbers obtained by discarding the fractional component of the result of the division.

$$\left. \begin{array}{l} x' = \left(\frac{x}{2}\right) \\ y' = \left(\frac{y}{2}\right) \\ z' = \left(\frac{z}{2}\right) \end{array} \right\} \quad (IV)$$

As described above, the addresses of the vertices of each unit division are distributed in the different memory banks, each having independent address lines and data lines.

Now, the present invention will be described with reference to a n-dimensional system, wherein each unit division has n vertices with n-dimensional addresses $(A_1, A_2, A_3, \ldots$ and $A_n)$ $(n=1, 2, 3, \ldots)$.

In this embodiment, the memory is divided into $2^n$ memory banks t0, t1, t2, t3, ... and $t(2^n-1)$, each having independent address lines and data lines. Generally, an address data $(A_1, A_2, A_3, \ldots, A_n)$ is stored into a memory bank $tp_n$, wherein a serial number $p_n$ is obtained by the following formula (V) which is developed from the above mentioned formulae (I) and (III), wherein $MODE_n(\ )$ means a residue obtained by dividing a number in parenthesis by $2^n$.

$$\begin{aligned} p_n &= MODE_n(A_1 + 2A_2 + 4A_3 + 8A_4 + \ldots + 2^{n-1}A_n) \\ &= MODE_n\left(\sum_{k=1}^{n} 2^{k-1}A_k\right) \end{aligned} \quad (V)$$

Further, the relation between the address $(A_1, A_2, A_3, A_4, \ldots, A_n)$ of the memory and the address $(A_1', A_2', A_3', A_4', \ldots, A_n')$ of each memory bank is determined in the following formulae (VI) in the same manner of those (II) and (IV) of the above described embodiments.

$$\left.\begin{array}{l}A_1' = \left(\dfrac{A_1}{2}\right) \\ A_2' = \left(\dfrac{A_2}{2}\right) \\ \vdots \quad \vdots \\ A_n' = \left(\dfrac{A_n}{2}\right)\end{array}\right\} \quad \text{(VI)}$$

Hence, according to the present invention, the n-dimensional addresses of the vertices of each unit division are distributed in the different memory banks, each having independent address lines and data lines, in the n-dimensional system.

It is readily understood from the above description that the addresses of the vertices of each unit division can be accessed at the same time. This differs from conventional methods in which the addresses must be accessed one at a time. The method of the invention is applicable even when the addresses become multidimensional and the addresses of the vertices of each unit division increase to a large number. Therefore, the time for accessing the memory locations corresponding to a unit division is significantly reduced according to the present invention.

In the above described embodiments of the present invention, the simultaneous access to the plurality of memory banks need not always be at the same absolute addresses, since each memory bank has independent address lines and its data can be retrieved independently of the data in the other memory banks.

One embodiment of the present invention will now be described. Of course, the present invention is not restricted to this embodiment.

When a first set of signals are converted into a second set of signals through a predetermined set of calculations, if the calculations taken a long time, and are performed over and over again, the second signals may be precalculated and the results stored in a memory look-up table. Then the data can be retrieved at any time by using the first signals as the addressing signals, thereby performing a signal conversion at a very high rate.

Figure 6:
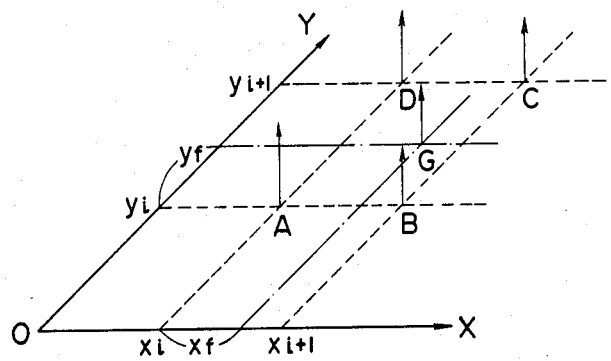
FIG. 6 is a schematic view for explaining an interpolation according to the present invention.

When two-dimensional first signals (x,y) are to be converted into two-dimensional second signals F(x,y), the obtained second signals corresponding to the first signals may be stored into a memory look-up table. As shown in FIG. 6, the second signal $F(x_i+x_f, y_i+y_f)$, wherein $x_i$ and $y_i$ indicate integral parts and $x_f$ and $y_f$ indicate decimal parts, corresponding to the first signal $(x_i+x_f, y_i+y_f)$, may be represented as a point G. This result may be obtained from the values $F(x_i, y_i)$, $F(x_i+1, y_i)$, $F(x_i, y_i+1)$ and $F(x_i+1, y_i+1)$, hereinafter referred to as interpolation data, of the second signals stored at the vertices of one interpolation area ABCD, according to the following formula (VII) for a straight line interpolation method.

$$\begin{aligned}F(x_i + x_f, y_i + y_f) = {} & F(x_i, y_i)(1 - x_f)(1 - y_f) \\ & + F(x_i + 1, y_i)x_f(1 - y_f) \\ & + F(x_i, y_i + 1)(1 - x_f)y_f \\ & + F(x_i + 1, y_i + 1)x_f y_f\end{aligned} \quad \text{(VII)}$$

In order to perform such an interpolation, in a conventional method, the interpolation data are stored into one memory look-up table having a conventional address arrangement and thus must be read out of the look-up table one value at a time. However, as described above, according to the present invention, since a set of interpolation data corresponding to the addresses of the vertices of the unit division are stored in the different memory banks, the set of the interpolation data can be conveniently read out at the same time from the plurality of memory banks where all data is stored.

That is, according to the present invention, a set complete of interpolation data is read out in a time period during which the prior art reads out only a single data element. Therefore, in a two-dimensional system of the present invention, the time for retrieving the data for a unit division is reduced to one fourth of the time required according to the prior art.

Furthermore, the present method can be applied very effectively to a multidimensional memory look-up table for use in a color picture signal conversion, as described hierinafter in detail.

When a first set of color separation digital picture signals C, M, Y and K of a first signal system, employing cyan, magenta, yellow and black, corresponding to printing inks, are converted into a second set of color separation digital picture signals R, G and B of a second signal system, employing red, green and blue for reproducing images, the method of the invention can be used to simulate the final color on a video system. An expected printing finish according to the first picture signals is simulated by using a CRT monitor of a color scanner setup means or an electronic color proofreader. Values $U(C_i, M_i, Y_i, K_i)$ of the second picture signals R, G and B are obtained in advance by performing a simulation arithmetic calculation and a signal conversion of upper four bits $C_i, M_i, Y_i$ and $K_i$, corresponding to the integral parts, of the first picture signals C, M, Y and K expressed in 256 gradation (8 bits), are stored in a memory look-up table, in advance, whose addresses are derived by a method according to the present invention. Hence, the interpolation can be carried out thereafter at a high speed as follows.

In this embodiment, since the addresses (C, M, Y, K) of the memory look-up table are four-dimensional, the memory is divided into $2^4 = 16$ memory banks t0, t1, t2, t3, ... and t15. A serial number p4 of the memory bank tp4 is obtained by the following formula (VIII) which is obtained by substituting n=4, $A_1=C_i$, $A_2=M_i$, $A_3=Y_i$ and $A_4=K_i$ for the formula (V) described above, and the relation between the address $(C_i, M_i, Y_i, K_i)$ of the memory and the address $(C_i', M_i', Y_i', K_i')$ of the memory bank is determined by the following formula (IX), which is based on the formula (VI).

$$p_4 = \text{MODE}_4(C_i + 2M_i + 4Y_i + 8K_i) \quad \text{(IIX)}$$

$$\left.\begin{array}{l}C_i' = \left(\dfrac{C_i}{2}\right), M_i' = \left(\dfrac{M_i}{2}\right) \\ Y_i' = \left(\dfrac{Y_i}{2}\right), K_i' = \left(\dfrac{K_i}{2}\right)\end{array}\right\} \quad \text{(IX)}$$

Therefore, in this embodiment wherein the addresses are composed by the present method, the first picture signals $C=C_i+C_f$, $M=M_i+M_f$, $Y=Y_i+Y_f$ and $K=K_i+K_f$, wherein $C_f, M_f, Y_f$ and $K_f$ correspond to lower four bits, may be obtained by determining $0 \leq C_f$, $M_f, Y_f, K_f < 1$, which in turn may be obtained from one unit division by the interpolation of a set of 16 values $U(C_i, M_i, Y_i, K_i), U(C_i+1, M_i, Y_i, K_i), \ldots$ and $U(C_i+1,$ $M_i+1$, $Y_i+1$, $K_i+1$). Thus, 16 interpolation data corresponding to 16 addresses ($C_i$, $M_i$, $Y_i$, $K_i$), ($C_i+1$, $M_i$, $Y_i$, $K_i$), . . . and ($C_i+1$, $M_i+1$, $Y_i+1$, $K_i+1$) of the vertices of the unit division including a point to be interpolated, can be read out of the different memory banks at the same time. Thus, the access time is significantly reduced according to the present invention.

By using the read-out interpolation data, the corresponding second picture signals R, G and B can be obtained according to the straight line interpolation method expressed by the following formula (X) or another simple interpolation method disclosed in Japanese Patent Application No. 52-57198 (Japanese Patent Laying-Open Specification No. 53-123201).

$$\begin{aligned}
U(C_i + C_f, M_i + M_f, Y_i + Y_f, K_i + K_f) = & \quad (X) \\
U(C_i, M_i, Y_i, K_i)(1 - C_f)(1 - M_f)(1 - Y_f)(1 - K_f) & \\
+ U(C_i + 1, M_i, Y_i, K_i)C_f(1 - M_f)(1 - Y_f)(1 - K_f) & \\
+ U(C_i, M_i + 1, Y_i, K_i)(1 - C_f)M_f(1 - Y_f)(1 - K_f) & \\
+ U(C_i, M_i, Y_i + 1, K_i)(1 - C_f)(1 - M_f)Y_f(1 - K_f) & \\
+ U(C_i, M_i, Y_i, K_i + 1)(1 - C_f)(1 - M_f)(1 - Y_f)K_f & \\
+ U(C_i + 1, M_i + 1, Y_i, K_i)C_f M_f(1 - Y_f)(1 - K_f) & \\
+ U(C_i + 1, M_i, Y_i + 1, K_i)C_f(1 - M_f)Y_f(1 - K_f) & \\
+ U(C_i + 1, M_i, Y_i, K_i + 1)C_f(1 - M_f)(1 - Y_f)K_f & \\
+ U(C_i, M_i + 1, Y_i + 1, K_i)(1 - C_f)M_f Y_f(1 - K_f) & \\
+ U(C_i, M_i + 1, Y_i, K_f + 1)(1 - C_f)M_f(1 - Y_f)K_f & \\
+ U(C_i, M_i, Y_i + 1, K_i + 1)(1 - C_f)(1 - M_f)Y_f K_f & \\
\ldots & \\
+ U(C_i + 1, M_i + 1, Y_i + 1, K_i)C_f M_f Y_f(1 - K_f) & \\
+ U(C_i, M_i + 1, Y_i + 1, K_i + 1)(1 - C_f)M_f Y_f K_f & \\
+ U(C_i + 1, M_i, Y_i + 1, K_i + 1)C_f(1 - M_f)Y_f K_f & \\
+ U(C_i + 1, M_i + 1, Y_i, K_i + 1)C_f M_f(1 - Y_f)K_f & \\
+ U(C_i + 1, M_i + 1, Y_i + 1, K_i + 1)C_f M_f Y_f K_f &
\end{aligned}$$

In FIG. 7 there is shown an arithmetic circuit for performing the interpolation expressed by the formula (X), comprising 16 memory banks $10_1$–$10_{16}$ which output the interpolation data, selectors $11_1$–$11_{16}$, $12_1$–$12_{16}$, $13_1$–$13_{16}$ and $14_1$–$14_{16}$ which select $C_f$ or $1-C_f$, $M_f$ or $1-M_f$, $Y_f$ or $1-Y_f$, and $K_f$ or $1-K_f$, respectively, subtracters $15_1$–$15_{16}$, $16_1$–$16_{16}$, $17_1$–$17_{16}$ and $18_1$–$18_{16}$ which calculate $1-C_f$, $1-M_f$, $1-Y_f$ and $1-K_f$, respectively, multipliers $19_1$–$19_{16}$, $20_1$–$20_{16}$, $21_1$–$21_{16}$ and $22_1$–$22_{16}$ for multiplying the outputs of the selectors 11–14 and the memory banks 10, and adders $23_1$–$23_{15}$ which sum up the multiplied values, thereby obtaining the interpolated value $U(C_i+C_f, M_i+M_f, Y_i+Y_f, K_i+K_f)$.

In this embodiment, the interpolation data can be read out of the memory banks at the same time, and the calculation of the interpolation can be performed at the same time. Hence, the processing time of the interpolation can be largely reduced as compared with the conventional method.

Although the present invention has been described in some detail by way of illustration and example for purpose of clarity of understanding, it will, of course, be understood that various changes and modifications may be made in the form, details, and arrangements of the parts without departing from the scope of the present invention.

What is claimed is:

1. A method for subdividing the memory locations of an n-dimensional memory into distinct groups and allocating each group to a respective memory bank, wherein said n-dimensional memory includes defined therein a plurality of unit divisions, each unit division having a plurality of vertices, each one of said vertices being identified by a unique n-dimensional address, said method comprising the steps of:

providing $2^n$ of said respective memory banks wherein said n equals the number of dimensions associated with said n-dimensional memory, each one of said memory banks being identified by a unique identifying number; and deriving from each said n-dimensional address a value which corresponds to said identifying number, said value indicating to which said respective memory bank said n-dimensional address is to be allocated, said value being mathematically derived from said n-dimensional address such that no two n-dimensional addresses associated with a given one of said unit divisions are allocated to a single memory bank.

2. The method of claim 1, wherein said unique identifying number of said memory banks is an integer selected from the series of integers 0, 1, 2, 3 . . . $2^n-1$ and in which each of said n-dimensional addresses is represented as one of the series $A_1$, $A_2$, . . . , $A_n$ and in which said value for each n-dimensional address equals the residue which is obtained by dividing $$\sum_{k=1}^{n} 2^{k-1} \cdot A_k$$

by $2^n$, wherein k is an integral counter than runs from 1 to n for performing said summation.

3. The method of claim 2, in which each n-dimensional address which is allocated to a given memory bank is reassigned a new n-dimensional address, the new n-dimensional address being derived from the relationship $$A_1' = \left(\frac{A_1}{2}\right), A_2' = \left(\frac{A_2}{2}\right), \ldots A_n' = \left(\frac{A_n}{2}\right)$$

in which only the integer result of the calculation is used for the new n-dimensional address and the fractional part is discarded.

4. The method of claim 1, in which the steps are applied to convert a first set of color signals C, M, Y and K which correspond to cyan, magenta, yellow and black color inks to a second set of color signals R, G and B corresponding to red, green and blue colors which are employed in a color display system, said method including the steps of providing $2^4$ of said memory banks, each one of said memory banks having independent data lines and address lines, each one of said memory banks being identified by a unique one of the series of numbers, 0, 1, 2, 3, . . . and 15, each n-dimensional address being represented as (C, M, Y, K) corresponding respectively to said cyan, magenta, yellow and black signals, each one of said n-dimensional addresses being allocated to a respective memory bank whose identifying number equals the residue of the equation $C+2M+4Y+8K/2^4$.

5. The method of claim 1, in which each of said memory banks comprises independent data lines and address lines.

6. The method of claim 2, in which each of said memory banks comprises independent data lines and address lines.

7. The method of claim 3, in which each of said memory banks comprises independent data lines and address lines.

8. The method of claim 1, wherein said unique identifying number of said memory banks is an integer selected from the series of integers 0, 1, 2, 3, . . . $2^n-1$ and wherein each of said n-dimensional addresses is represented as one of the series $A_1, A_2, \ldots, A_n$ and wherein said value for each n-dimensional address equals the residue which is obtained by dividing the quantity $$2^0.A_1 + 2^1.A_2 + 2^2.A_3 + \ldots + 2^{n-1}.A_n$$

by the quantity $2^n$.

9. A memory based, multi-dimensional, interpolation apparatus for providing, simultaneously, a set of data associated with and derived from an n-dimensional data base which includes a plurality of unit divisions, each unit division having a plurality of vertices, each of said vertices being identified by an n-dimensional address, said apparatus comprising:
   $2^n$ memory banks, n being equal to the dimension of the interpolation apparatus;
   means for mathematically deriving from each n-dimensional address a value, said value determining in which one of said memory banks a data item corresponding to said n-dimensional address is to be stored, said data item being stored in a memory bank in which another data item associated with said set of data is not stored; and
   means for generating addresses for each one of said memory banks to thereby enable simultaneous retrieval of said set of data from said memory banks.

10. A method for subdividing the memory locations of an n-dimensional memory into distinct groups and allocating each group to a respective memory bank to provide simultaneous access to sets of data stored in said memory locations, comprising the steps of:
    defining in the memory locations of said n-dimensional memory a plurality of unit divisions, each unit division to contain one such set of data to be accessed, and each unit division having a plurality of vertices for containing the respective data constituting such set of data, and each one of said vertices being identified by a unique n-dimensional address,
    subdividing the memory locations of said memory into $2^n$ respective memory banks, wherein n equals the number of dimensions associated with said n-dimensional memory, each one of said memory banks being identified by a unique identifying number; and
    deriving from each said n-dimensional address a value which corresponds to one of said identifying numbers, said value indicating to which said respective memory bank said n-dimensional address is to be allocated, said value being mathematically derived from said n-dimensional address such that no two n-dimensional addresses associated with a given one of said unit divisions are allocated to a single memory bank.

11. The method of claim 10, wherein said unique identifying number of said memory banks is an integer selected from the series of integers $0, 1, 2, 3, \ldots 2^n-1$ and in which each of said n-dimensional addresses is represented as one of the series $A_1, A_2, \ldots, A_n$ and in which said value for each n-dimensional address equals the residue which is obtained by dividing the quantity $$2^0.A_1 + 2^1.A_2 + 2^2.A_3 + \ldots + 2^{n-1}.A_n$$

by the quantity $2^n$.

12. The method of claim 11, in which each n-dimensional address which is allocated to a given memory bank is reassigned a new n-dimensional address, the new n-dimensional address being derived from the relationship $$A_1' = \left(\frac{A_1}{2}\right), A_2' = \left(\frac{A_2}{2}\right), \ldots A_n' = \left(\frac{A_n}{2}\right)$$

in which only the integer result of the calculation is used for the new n-dimensional address and the fractional part is discarded.

13. The method of claim 10, in which each of said memory banks comprises independent data lines and address lines.

14. The method of claim 11, in which each of said memory banks comprises independent data lines and address lines.

15. The method of claim 12, in which each of said memory banks comprises independent data lines and address lines.

* * * * *